United States Patent [19]

Fontanes

[11] 4,095,219

[45] June 13, 1978

[54] ARRANGEMENT FOR CODING WITH COMPRESSION THE ABSOLUTE VALUE OF AN ANALOG SIGNAL

[75] Inventor: Sylvain Fontanes, Paris, France

[73] Assignee: Thomson-CSF, Paris, France

[21] Appl. No.: 727,538

[22] Filed: Sep. 28, 1976

[30] Foreign Application Priority Data

Oct. 2, 1975 France .................................. 75 30233

[51] Int. Cl.² ............................................. H03K 13/02
[52] U.S. Cl. .......................... 340/347 NT; 307/221 D; 357/24; 179/15 AV
[58] Field of Search .......... 340/347 AD; 179/15 AV; 357/24; 307/221 C, 221 D; 333/70 T

[56] References Cited

U.S. PATENT DOCUMENTS

| 3,877,028 | 4/1975 | Thomas ..................... 340/347 DA X |
| 3,903,543 | 9/1975 | Smith ............................. 340/347 AD |
| 3,905,028 | 9/1975 | Wintz et al. ................ 179/15 AV X |
| 3,984,829 | 10/1976 | Zwack ........................ 179/15 AV X |
| 4,011,548 | 3/1977 | Panigrahi ............................... 357/24 |

Primary Examiner—Thomas J. Sloyan
Attorney, Agent, or Firm—Cushman, Darby & Cushman

[57] ABSTRACT

The holding integrator of the arrangement, which integrator is to integrate the signal to be encoded during time intervals $T_1 = pT$ separated by time intervals $T_2 = qT$ in the course of which the integrated value is to be memorized for comparison with one or two ramp signals, comprises a charge transfer device with (p+q) stages receiving advance signals having a period T. The signal to be encoded is applied to the injection circuit of the charge transfer device during the intervals $T_1$ while a zero voltage is applied thereto during the intervals $T_2$.

5 Claims, 5 Drawing Figures

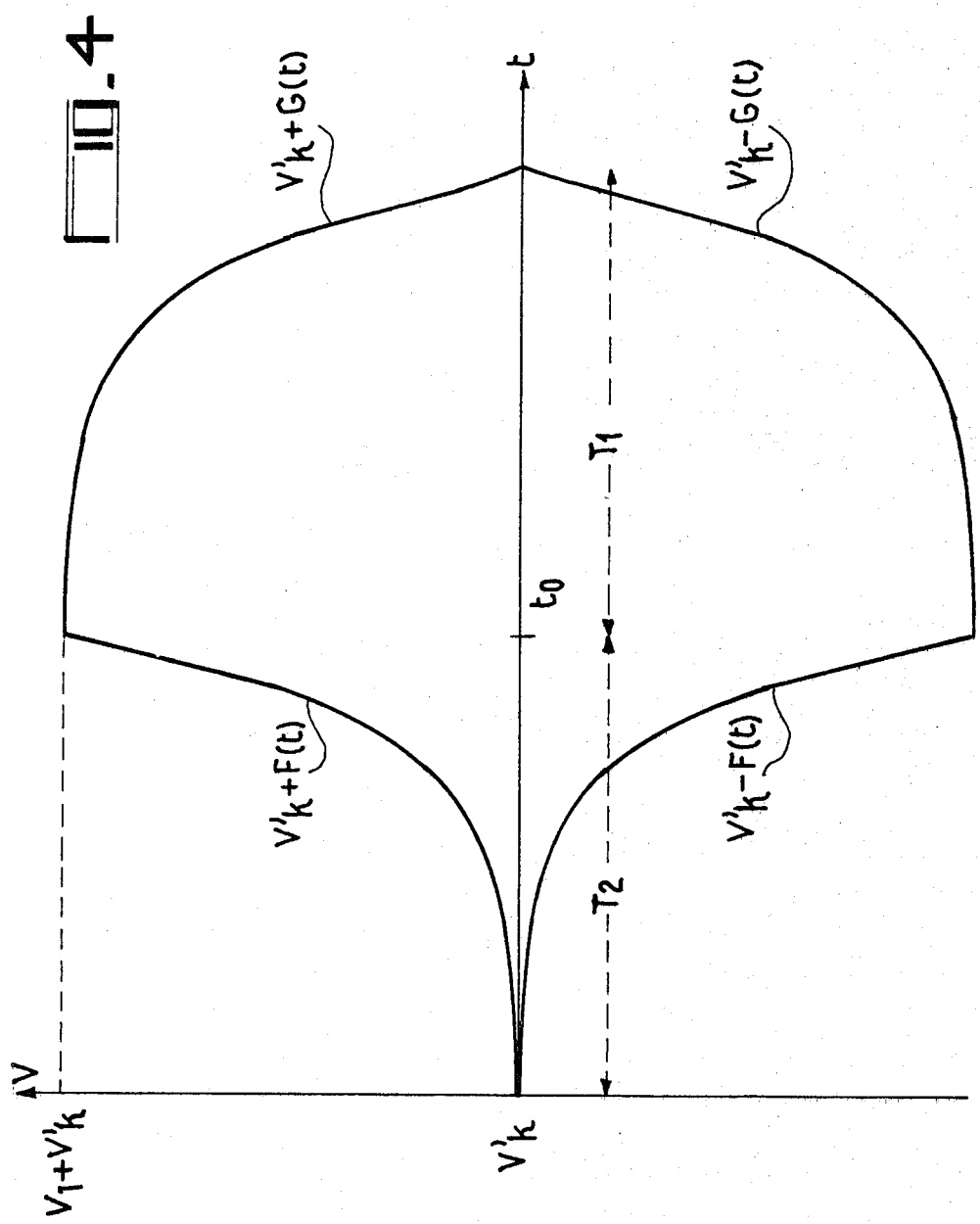

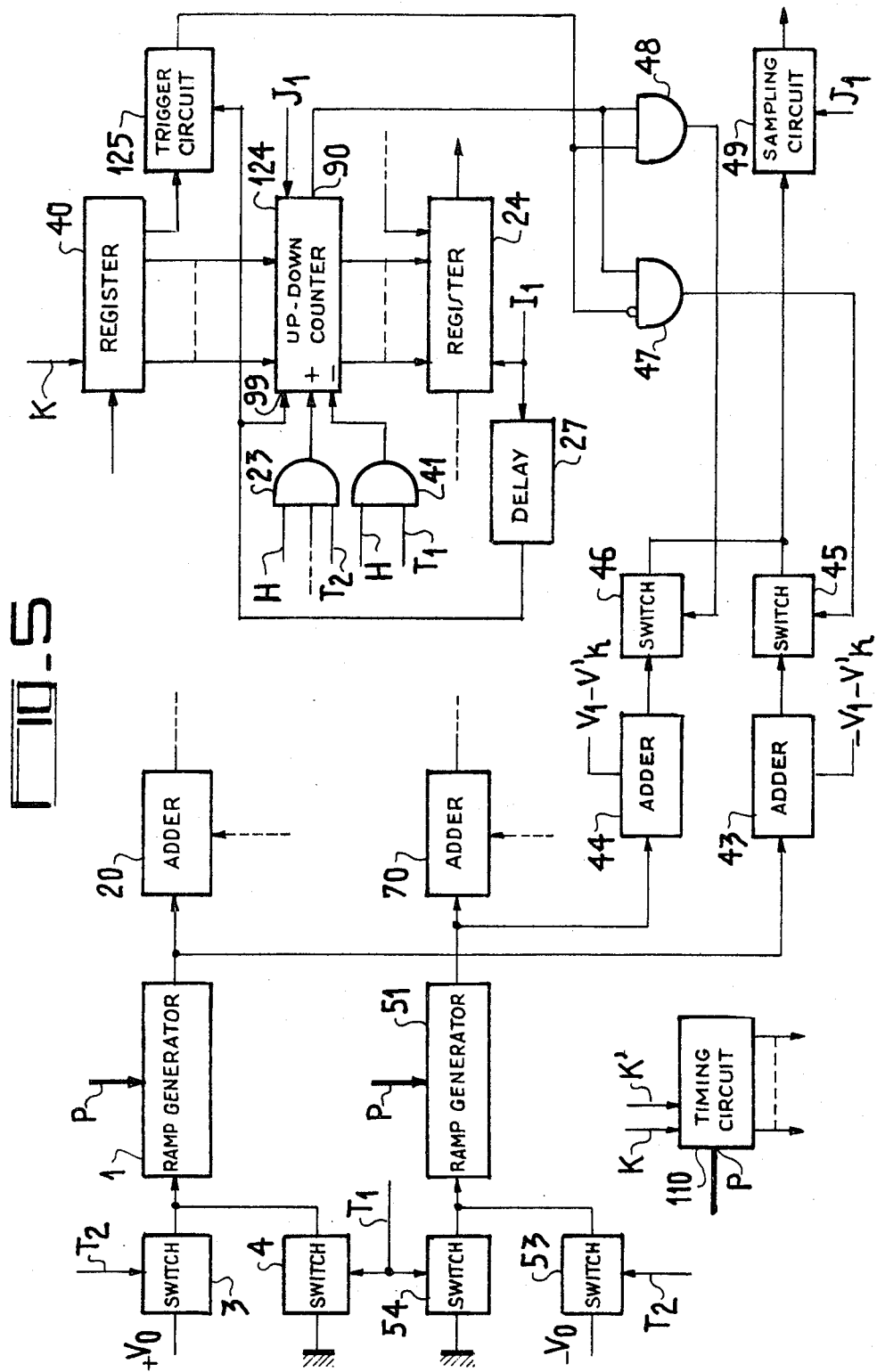

ARRANGEMENT FOR CODING WITH COMPRESSION THE ABSOLUTE VALUE OF AN ANALOG SIGNAL

This invention relates to an improvement in arrangements for coding with compression the absolute value of an analog signal, using at least one holding integrator for integrating this analog signal, during time intervals of duration $T_1$, hereinafter referred to as intervals $T_1$, separated by time intervals of duration $T_2$, hereinafter referred to as intervals $T_2$, and for comparing the signal which has been integrated during an interval $T_1$ with at least one ramp signal, dependent upon the required compression law, during the following interval $T_2$, with pulse counting for a duration determined by the instant when the ramp signal is equal to the integrated signal.

In the prior art, the holding integrators used for this purpose hold the integrated value at the terminals of a capacitor, which means that it is difficult to avoid charge losses when the duration of the ramp signal, for which the integrated value has to be held, is not negligible.

On the other hand, it is necessary to provide time intervals $T_2$ longer in duration than the ramp signal to enable the capacitor to discharge before another integration.

The present invention enables these disadvantages to be obviated.

According to the invention, there is provided an arrangement for coding with compression the absolute value of an analog signal, said arrangement comprising integrating means for integrating said analog signal during first periodic time intervals having a duration $T_1$ and referred to as intervals $T_1$ separated by second periodic time intervals having a duration $T_2$ and referred to as intervals $T_2$, and holding for the duration $T_2$ the integrated signal resulting from the integration of said analog signal during an interval $T_1$; means for generating in the course of each interval $T_2$ $n$ ramp signals having a common absolute value, $n$ being a positive integer; means for comparing during each interval $T_2$ the absolute value of the integrated signal obtained during the preceding interval $T_1$ with the absolute value of said ramp signals; means for generating clock pulses; and means for, in the course of each one of said second time intervals, counting said pulses for a duration determined by the instant when the absolute value of said $n$ ramp signals is equal to the absolute value of the integrated signal, wherein, $T_1$ and $T_2$ being multiples of a common duration $T$, said integrating means comprise: at least one integrating charge transfer device having $(p+q)$ successive stages having identical weighting coefficients, with $p = T_1/T$ and $q = T_2/T$, an injection circuit coupled to the first of these stages, and an output circuit for delivering, with a possible constant voltage added thereto, a signal resulting from the integration of the signal applied to said injection circuit; means for alternately applying to said injection circuit said analog signal and a fixed voltage so that the charges injected in the first of said stages are a function of said analog signal during said intervals $T_1$ and have a fixed value during said intervals $T_2$, whereby said output circuit delivers, with said possible constant voltage added thereto, said integrated signal during each interval $T_2$.

The invention will be better understood and other features thereof will become apparent from the following description in conjunction with the accompanying drawings, wherein:

FIG. 4 shows explanatory curves.

FIG. 5 is a variant of the encoder illustrated in FIG. 3 enabling it to be used for decoding during the integration of the signal to be encoded.

The encoders-compressors to be described hereinafter comprise ramp generators, also formed by charge transfer device, and fed with a constant voltage for producing a ramp signal, as provided in U.S. patent application Ser. No. 698,784, filed June 22, 1976 assigned to the same assignee as the present application.

It will be recalled that a charge transfer device, CTD in short, receiving advance signals having a common period T, and phase-shifted relative to one another, and into the first stage of which a charge $q(nT)$ is injected at the instants $nT$, $n = 1, 2$ etc., supplies at the instants $nT + \tau$, where $\tau$ is a positive constant equal at most to T, an output signal $R(nT + \tau)$ equal to $$(1/C) \sum_{i=1}^{m} h_i q(p_i T),$$

where $m$ is the number of stages of the CTD, $h_i$ is the weighting coefficient of its $i^{th}$ stage, $p_i = n - i + 1$, and C is a constant having the dimensions of a capacitance characteristic of the CTD. This output signal is formed by a sampled signal superimposed upon a constant voltage $V_k$ determined by the voltage added to the input signal of the injection circuit of the CTD so that this injection circuit operates in a linear interval, and by the sum $$\sum_{i=1}^{m}$$

$h_i$ of the weighting coefficients of the stages.

For certain CTD's, this output signal which is extracted from one of the phases of the advance signals of the CTD may be converted into a smoothed signal $s(t)$ increased by the voltage $V_k$ by means of a simple filter. For obtaining the output signal $s(t) + V_k$, certain CTD's for example those which use divided electrodes for weighting, have a more complex output circuit, also known as a measuring circuit.

A charge transfer device comprising not only its injection circuit, but also its output circuit, will be referred to hereinafter as a functional CTD.

A description of CTD's, an explanation of their operation and the shape to be given to the advance voltages can be found in the Article by Gilbert F. Amelio entitled "Charge-Coupled Devices" in the Journal Scientific American, Vol. 230, n° 2, February, 1974.

Methods for imparting the weighting coefficients of the stages are described in the Article by Dennis D. Buss et al entitled "Transversal Filtering Using Charge-Transfer Devices" in the Journal IEEE Journal of Solid-State Circuits, Vol. SC8, n° 2, April, 1973.

Figure 1:
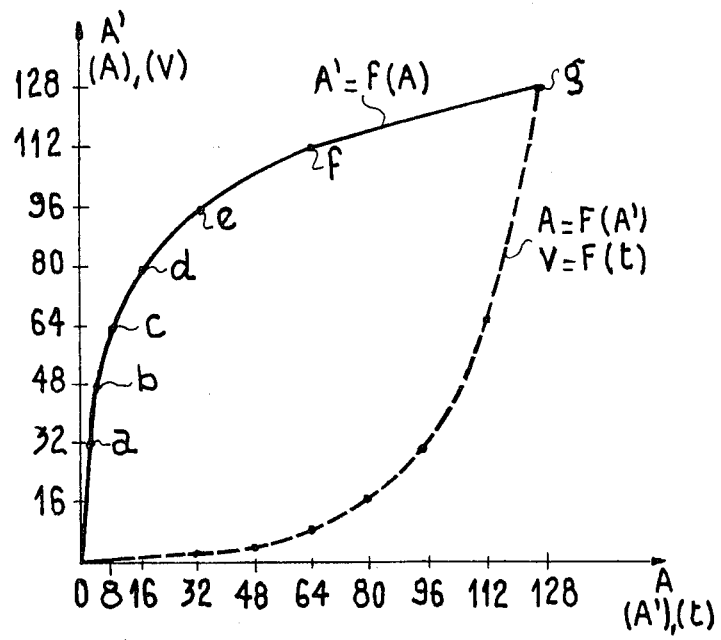
FIG. 1 is a compression curve.

FIG. 1 shows, for positive values of A and A', a known compression curve $A' = f(A)$, the most common in Europe. The real amplitudes A are shown as abscissae, whilst the compressed amplitudes A' are shown as ordinates.

The axis of the compressed amplitudes A' is graduated in quantization levels of which the number, for each polarity of A, is equal to 128. For reasons of convenience, the axis of the real amplitudes A is graduated on an identical scale from 0 to 128, the value 128 having been attributed to the maximum value of A, and the unit length being the same on the two axes.

The total characteristic is of course symmetrical in relation to the origin. It is sufficient to describe the positive part. It is made up of 7 rectilinear segments, the gradient of each segment being half the gradient of the preceding segment.

The intersections of the successive segments starting from the central segment have respectively for abscissa and ordinate: $a$ : 2 and 32; $b$ : 4 and 48; $c$ : 8 and 64; $d$ : 16 and 80; $e$ : 32 and 96; $f$ : 64 and 112; the ordinates of the end $g$ are 128 and 128.

With the scales adopted for the graphic representation, the corresponding expansion curve $A = F(A')$, A' being on this occasion recorded on the abscissa and A on the ordinate, as shown by the notations (A') and (A), is symmetrical with the compression curve relative to the bisector of the axes of the co-ordinates. This curve is shown in broken lines.

Seven bits are required for encoding 128 quantification stages. In the case of an input signal with two polarities, a sign bit is added thereto, 1 for the positive values, 0 for the negative values.

Figure 2:
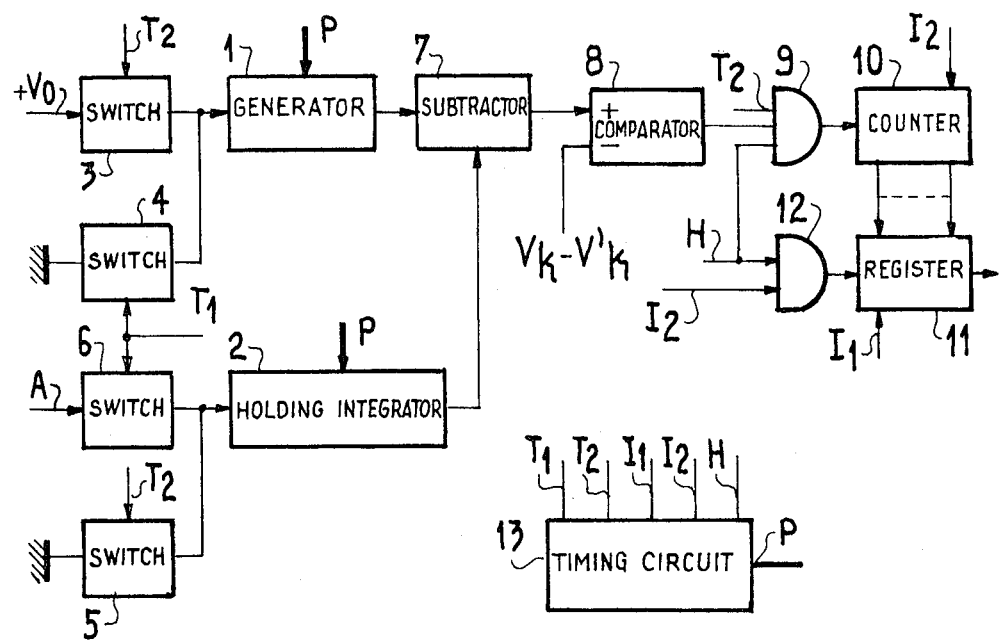
FIG. 2 shows an arrangement according to the invention for encoding a signal of constant polarity.

The encoder shown in FIG. 2 uses the known principle of sampling the analog signal by integration thereof during a time interval $T_1$ by means of a linear holding integrator which holds the integrated value for a time $T_2$ long enough for a ramp generator to supply a signal $V = F(t)$ of which the representative curve, with a unit of time equal to $T_2/128$ and, for V, a unit $V_o$ equal to 1/128 of the integrated signal for the maximum value of A, is identical with the curve $A = F(A')$ shown in FIG. 1, as indicated by the further notations (t) on the axis of the abscissae and (V) on the axis of the ordinates in FIG. 1.

With the unit of time $T_2/128$, the quantized time taken by the ramp generator to supply a ramp signal equal to the output signal of the integrator will be numerically equal to the encoded number of 7 bits which translates A'. In order to obtain this encoded number, it is sufficient to feed a modulo 128 counter reset to zero before the beginning of the time interval $T_2$ and receiving a first pulse at the time $T_2/128$, the quantification intervals 0-1, 1-2 . . . 127-128 being encoded by the number translating their lower limit.

Since, in this example, encoding takes place at a frequency of 8 kHz, the duration $T_1 + T_2$ of a cycle is 125 μs. In addition, it has been assumed that $T_1 = T_2$.

In FIG. 2, a timing circuit 13, comprising a pilot at 6144 = (2048)3 kHz, supplies clock pulses H at a frequency of 2048 kHz and various periodic signals to the elements described hereinafter. The corresponding connections have not been shown, but the inputs receiving signals from the timing circuit will be designated by the same symbol as the signals which they receive. On the other hand, a time interval corresponding to the duration of a signal from the timing circuit will be designated by the same symbol as that signal, these same conventions applying to all the diagrams.

The ramp generator and holding integrator of the encoder shown in FIG. 2 are formed by functional CTD's.

For each clock time, the advance input of each of these devices receives signals phase-shifted relative to one another, generally three, of which the common period forms the above-mentioned clock time T.

In FIG. 2, the functional CTD 2, used as holding integrator, comprises 256 stages of which all the coefficients $h$ are equal to 1. Its advance input receives the above-mentioned three-phase signal P of the programmer at a triple input represented by a thicker wire than the single inputs. By means of two switches 5 and 6, its signal input may either be connected to ground or receive the input voltage A. The signal is assumed to be of permanently positive polarity. One encoding cycle comprises 256 clock times T (period of the pulses H) of the device 2. The timing circuit supplies pulses $T_1$ of duration 128T separated by pulses $T_2$ of equal duration. The pulses $T_1$ are applied to the switch 6 to close it, whilst the pulses $T_2$ close the switch 5.

At the beginning of a time interval $T_1$, when the device 2 has received the ground voltage during 128 clock times, its first 128 stages each contain the same charge $q(o)$ dependent upon the voltage added to the input signal in the injection circuit.

At the end of the time $T_1$, the first 128 stages of the device 2 will each contain a charge $q(a) = q(o) + Q(A)$ which only varies from one stage to the other through fluctuations in the voltage A, whilst its last 128 stages will each contain the charge $q(o)$.

The output signal, corresponding to the integration of the voltage A, is $S(A) + V_k$, $V_k$ being a constant voltage emanating from the 256 charges $q(o)$.

Since the input of the device is connected to ground and since the last 128 stages of the device had charges $q(o)$, the charges of the device will remain unchanged during the following time $T_2$.

At the end of the time $T_2$, charges $q(o)$ will reappear at the first 128 stages of the device.

On the other hand, the encoder comprises a ramp generator 1 which receives the same advance signals P as the integrator 2.

The ramp generator comprises 128 stages of which the first 32 are allotted the coefficient 1, the following 16 the coefficient 2, the following 16 the coefficient 4 and so on, the coefficient doubling from one group of 16 stages to the next.

During the intervals $T_1$, the input of the generator 1 is connected to ground through a switch 4 receiving the pulses $T_1$. During the intervals $T_2$, it is connected to a source of positive voltage $+ V_o$ through a switch 3 receiving the pulses $T_2$. The various phases are so adjusted that, during an interval $T_2$, the generator 1 supplies a smoothed signal corresponding to the curve $V = F(t)$ of FIG. 1, except for a constant $V'_k$, and that the output voltage of the integrator has responded to the 128 charges $q(A)$ in time for the comparison to be made. The output signal of the ramp generator is subtracted from the output signal of the integrator in a subtractor 7 of which the output is connected to the "+" input of a comparator 8 of which the "−" input is connected to a source of voltage $V_k - V'_k$ (negative if $V'_k > V_k$). This comparator supplies a signal 1 if the voltage applied to its "+" input is algebraically higher than the voltage applied to its "−" input and a zero signal in the opposite case. All the comparators used in the various block diagrams are of this type. The output of the comparator 8 is connected to the first input of a three-input AND gate 9, of which the second input receives the pulses H and its third input the pulses $T_2$. The relative phases of the pulses $T_1$ and $T_2$ and of the pulses H are adjusted in such a way that the gate 9 does not let through the pulse H nominally coinciding with the leading edge of the pulses $T_2$. When $V(t) = S(A)$, the output signal of the comparator 8 becomes zero again, the gate 9 having allowed through the N pulses corresponding to the code N of the input signal.

The output of the gate 9 feeds a binary counter 10 which was reset to zero before the beginning of the intervals $T_2$. In order to avoid serious encoding errors in cases where the amplitude A exceeds its nominal maximum level, the counter includes a blocking device preventing it from passing, by counting, from its maximum count to the zero count.

The binary outputs of the counter are connected to the inputs of a register 11. At the beginning $t_o$ of the interval $T_1$, the count of the counter is recorded in the register under the control of a pulse $I_1$ applied to the recording input of this register. During a time interval $I_2$ later than $t_o$, the advance input of the register receives seven pulses H through an AND gate 12 of which the second input receives a pulse $I_2$ of adequate duration which ensures unloading of the register. Pulses $I_1$ and $I_2$ are supplied by the timing circuit 13.

The counter 10 is reset to zero by the leading edges of the pulses $I_2$ applied to a control input of this counter.

It will be noted that the unloading time of the register is short by comparison with the encoding time, which is desirable if the output signals of the encoder have to form part of a signal multiplexed in time.

The block diagram shown in FIG. 2 can only be used as such for signals with one polarity. It is of course possible to reverse the negative parts of an analog signal with two polarities before encoding its absolute value by the number N for the encoder shown in FIG. 2 and then to add the sign bit in dependence upon the polarity memorized to this end.

Figure 3:
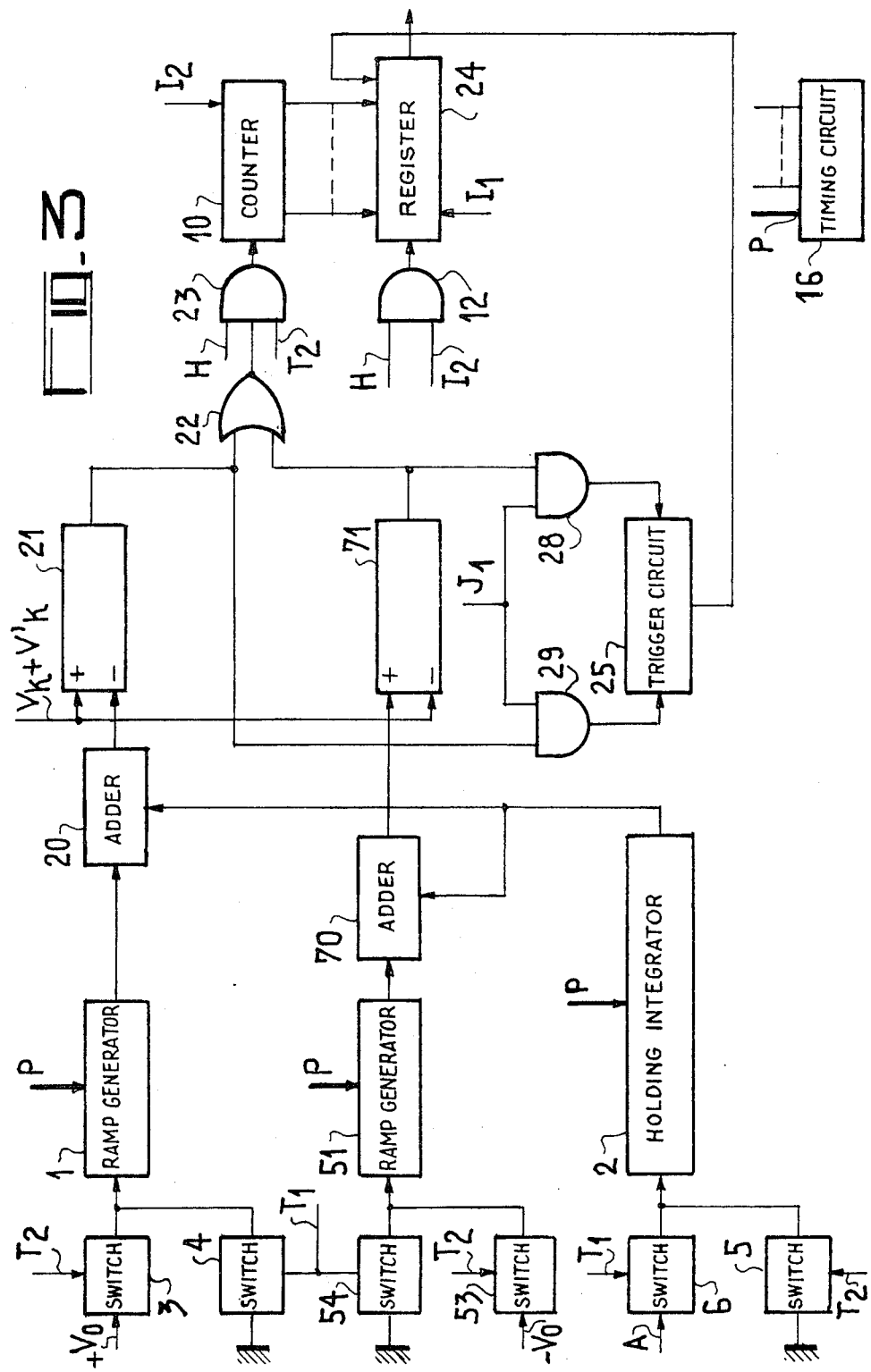
FIG. 3 shows an encoder comprising an arrangement according to the invention for encoding a signal with two polarities.

The block diagram shown in FIG. 3 is more suited to the use of the charge transfer device and uses the method in which certain elements are doubled.

A timing circuit 16 supplies the same signals H, $T_1$, $T_2$, P, $I_1$ and $I_2$ as before, as well as a pulse $J_1$ at the beginning of each interval $T_2$.

In the block diagram shown in FIG. 3, two ramp generators are used, one of which, 1, supplies a smoothed signal $V'_k + F(t)$ during the time $T_2$, in the same way as before, while the other, 51, supplies the signal $V'_k - F(t)$, as shown in FIG. 4.

FIG. 4 also shows the curves of the output signal during discharge, $V'_k + G(t)$ and $V'_k - G(t)$, of the two generators during the time $T_1$ following the time $T_2$.

It is preferred to use the generator 1 for encoding the negative samples and the generator 51 for encoding the positive samples, this enabling the comparison subtractors to be replaced by adders 4 detecting the equality of absolute value which is the only relevant factor for encoding apart from the sign bit.

FIG. 3 again shows the ramp generator 1 and the integrator 2 appearing in FIG. 2 and connected in the same way (the corresponding elements being denoted by the same references) except for the fact that their outputs no longer feed a subtractor, but instead an adder 20.

The input signal A has two polarities, as is the case in telephony.

The advance input receiving the signals P and the signal input of the second ramp generator 51 are fed in the same way as those of the generator 1, except for the fact that the voltage $+ V_o$ is replaced by $- V_o$. With this exception the switches 53 and 54 perform the same function for the generator 51 as the switches 3 and 4 for the generator 1. The generator 51 and the integrator 2 feed a second adder 70.

The output of the adder 20 is connected to the "−" input of a comparator 21 of which the "+" input receives a voltage $(V_k + V'_k)$.

The output of the adder 70 is connected to the "+" input of a comparator 71 of which the "−" input receives this same voltage.

It is immediately apparent that the comparator 21 will only supply a signal of level 1 if the sample to be encoded is negative and for as long as the signal $F(t)$ does not reach the same absolute value as the integrated signal $S(A)$.

Similarly, the comparator 71 will only supply a signal of level 1 if the sample to be encoded is positive and, in terms of absolute value, is below $- F(t)$.

The outputs of the two comparators are joined by an OR gate 22 which feeds a three-input AND gate 23 which in addition receives the pulses H and the pulses $T_2$.

This gate 23 performs the function of the gate 9 in FIG. 2 for the encoding of the absolute value of the sample by means of a counter 10 identical with that shown in FIG. 2.

In this case, however, the counter 10 feeds the first seven inputs of an eight-stage shift register 24 of which the last stage is intended to receive the sign bit.

The sign of the sample is detected by means of a bistable trigger circuit 25 of which the inputs for the state 1 and for the state 0 are respectively connected to the outputs of the comparators 71 and 21 through two AND gates 28 and 29 receiving from the timing circuit a pulse $J_1$ which coincides with the beginning of the intervals $T_2$. When the register receives the count N of the counter under the control of the pulse $I_1$ applied to the recording input of the register 24, it simultaneously receives the sign bit. The register is unloaded in the same way as before by means of advance pulses supplied by an AND gate 12 receiving the pulses H and the signal $I_2$ (assumed to be of adequate duration to allow through at least 8 pulses H).

Referring to the curves shown in FIG. 4, it can be seen that the discharge curve $V'_k + G(t)$ of the output signal of the generator 1 may be written $V'_k + V_1 - F(t - T_2)$ where $V_1$ is the maximum amplitude of $V(t)$, or by taking as the time origin the instant $t_o$ separating the intervals $T_2$ and $T_1$, $V'_k + V_1 - F(t)$.

If the interval $T_2$ is marked by pulses H of which the first nominally coincides with the beginning of $T_2$, the output signal of the generator 1, for the Nth pulse following this first pulse, will have an amplitude equal to the real amplitude of a negative signal of which the compressed value was encoded by the number N increased by $V_1 + V'_k$.

Similarly, it will be possible from the output signal of the generator 1 to know what is the real amplitude of a positive signal of which the compressed value had been encoded by a given number, the difference this time being $V'_k - V_1$.

These observations provide for the use of the ramp generators for decoding during the time intervals $T_1$.

FIG. 5 illustrates an encoder-decoder using the ramp generators 1 and 51 for encoding during the intervals $T_2$ and decoding during the intervals $T_1$.

The circuit shown in FIG. 5 comprises a register 40 which at its signal input receives the code to be decoded and, at its advance input, pulses K at the frequency of the incident bits, the pulses K being obtained by conventional means. Since the code to be decoded corresponds to a code with the same content as the code to be formed, one word of 8 bits is received for the duration of a cycle $T_1 + T_2$; the actual reception may have a very short duration by comparison with the duration of this cycle.

The circuit shown in FIG. 5 comprises a timing circuit 110 synchronised by means of pulses K as of pulses K' at the frequency of the series of 8 incident bits which are also obtained by conventional means. The timing circuit 110 supplies the signals of the preceding circuits, but the above-mentioned synchronisation enables a time interval $T_1$ to begin with the presence of a complete word in the register 40 and between two pulses K.

Since the intervals $T_1$ and $T_2$ are thus adjusted, encoding takes place in the same way as in the case of FIG. 3 with the same elements denoted by the same reference numerals, except for the fact that the counter 10 is replaced by an up-down counter 124 which also has seven stages, its "+" count input being connected to the output of the gate 23. This counter additionally comprises recording inputs connected to the outputs of the first seven stages of the register 40 and incorporates a zero decoder supplying a signal at an output 90 when the count of the counter is zero.

Since the entire encoding circuit operates in the same way as in the case of FIG. 3, except for the operation of the up-down counter 124 replacing the counter 10, some of the elements of the encoding circuit, which do not play any part in decoding, have not been shown in the interest of clarity of the drawing.

Following an encoding count and after the count of the counter 124 and the sign bit have been transferred to the output register 24 by the pulse $I_1$ coinciding with the beginning of a pulse $T_1$, the counter 124 is not reset to zero, but immediately receives the count N, recorded in the first seven stages of the register 40 by application of the pulse $I_1$, delayed very slightly by a delay element 27, to its recording input 99.

For decoding, the operations take place as follows: as already mentioned, the slightly delayed pulse $I_1$ records in the counter 124 the number N written in the first seven stages of the register 40. At the same time, this delayed pulse $I_1$ is applied to the clock input of a D type trigger circuit, denoted by the reference 125, of which the signal input is connected to the last stage of the register 40 and causes the sign bit associated with the number N to be registered in this trigger circuit.

The "−" backward counting input of the counter is connected to the output of an AND gate 41 receiving the pulses H and the pulses $T_1$. The foregoing observations on the relative phases of the signals H and $T_2$ also apply to the signals H and $T_1$ so that the gate 41 does not let through the pulse H nominally coinciding with the leading edge of the pulses $T_1$.

The voltage $-V_1 - V'_k$ is added to the output signal of the generator 1 in an adder 43.

The voltage $+V_1 - V'_k$ is added to the output signal of the generator 51 in an adder 44.

The outputs of the two adders 43 and 44 are respectively connected to the inputs of two switches 45 and 46 which are respectively controlled by two AND gates 47 and 48 both receiving the zero crossing signals supplied by the output 90 of the up-down counter 124. The second input of the gate 47 is an inversion input. The second inputs of the gates 47 and 48 receive the sign bit supplied by the trigger circuit 125. According to the value of this sign bit, the gate 47 or the gate 48 supplies a pulse when the counter 124 passes through the value O. The switch 46 or the switch 45 is thus closed, depending on whether the signal to be decoded is positive or negative. The outputs of these two switches are connected to the input of a sampling and holding circuit 49 which has been assumed to be of the conventional capacitance type. This sampling and holding circuit is discharged into the output channel of the decoder by the pulse $J_1$ marking the beginning of the intervals $T_2$. This same pulse is applied to the zeroing input of the up-down counter 124.

It is of course possible to associate a holding integrator with each of the two generators, for example for reasons of technological convenience, in the arrangements shown in FIGS. 3 and 5.

It was assumed, in the described examples, that the fixed voltage applied to the holding integrator during the intervals $T_2$ was a zero voltage. This is not necessary, a change in the value of this fixed voltage involving only a change in the constant $V_k$.

In the same way, the fixed voltage applied to a ramp generator during the intervals $T_1$ need not be a zero voltage, but of course it must be different from the voltage applied during the intervals $T_2$. Calling in a general way $U_1$ the first voltage, and $U_2$ the second voltage thus applied to a given ramp generator, $U_1$ determines the constant $V'_k$ and $U_2 - U_1$ the sign and amplitude of the ramp voltage.

It was also assumed that the duration $T_1$ was equal to the duration $T_2$. As far as the holding integrator is concerned, no special relation between $T_1$ and $T_2$ is necessary. If ramp generators of the type described, i.e. using DTC's are used, then $T_1$ must be at least equal to $T_2 - T$ for the ramp signal to repeat itself during each interval $T_2$. If the ramp generators are also used for decoding then $T_1$ should be at least equal to $T_2$.

Of course, the invention is not limited to the embodiments described and shown which were given solely by way of example.

What is claimed, is:

1. An arrangement for coding with compression the absolute value of an analog signal, said arrangement comprising integrating means for integrating said analog signal during first periodic time intervals having a duration $T_1$ and referred to as intervals $T_1$ separated by second periodic time intervals having a duration $T_2$ and referred to as intervals $T_2$, and holding for the duration $T_2$ the integrated signal resulting from the integration of said analog signal during an interval $T_1$; means for generating in the course of each interval $T_2$ n ramp signals having a common absolute value, n being a positive integer; means for comparing during each interval $T_2$ the absolute value of the integrated signal obtained during the preceding interval $T_1$ with the absolute value of said ramp signals; means for generating clock pulses; and means for, in the course of each one of said second time intervals, counting said pulses for a duration determined by the instant when the absolute value of said n ramp signals is equal to the absolute value of the integrated signal, wherein, $T_1$ and $T_2$ being multiples of a common duration T, said integrating means comprise:

at least one integrating charge transfer device having $(p+q)$ successive stages having identical weighting coefficients, with $p = T_1/T$ and $q = T_2/T$, an injection circuit coupled to the first of these stages, and an output circuit for delivering, with a possible constant voltage added thereto, a signal resulting from the integration of the signal applied to said injection circuit; means for alternately applying to said injection circuit said analog signal and a fixed voltage so that the charges injected in the first of said stages are a function of said analog signal during said intervals $T_1$ and have a fixed value during said intervals $T_2$, whereby said output circuit delivers, with said possible constant voltage added thereto, said integrated signal during each interval $T_2$.

2. An arrangement as claimed in claim 1, wherein $T_1$ is at least equal to $T_2 - T$, and comprising, for respectively generating said $n$ ramp signals, with possible constant voltages added thereto, $n$ ramp generators, each of which comprises a generating charge transfer device having $q$ successive stages, an injection circuit coupled to the first of said $q$ stages, and an output circuit; and means for applying to the injection circuit of said generating charge transfer device a first fixed voltage $U_1$ during said intervals $T_1$ and a second fixed voltage $U_2$ during said intervals $T_2$.

3. An arrangement as claimed in claim 2, wherein $n$ is equal to 2, wherein said analog signal is a two-polarity signal to be encoded by a sign bit added to the bits expressing its absolute value, and wherein the difference $U_2 - U_1$ is positive for one of said ramp generators and negative for the other of said ramp generators.

4. An arrangement as claimed in claim 3 comprising means for delivering a signal controlling the end of said counting of said clock pulses when the sum of said integrated signal and either one of the two ramp signals is zero.

5. An arrangement as claimed in claim 3, with $T_1 > T_2$ further comprising decoding means for generating, during an interval $T_1$, two analog signals having opposite polarities and a common absolute value equal to the absolute value of an analog signal coded with compression by a number N supplied at the beginning of this time interval $T_1$, said decoding means including: first and second adders, having respective outputs, for adding the output signals from said two ramp generators with two constant voltages respectively; mean for counting said number N of said clock pulses starting from the beginning of this time interval $T_1$; and means for memorizing the output signals from said first and second adders when said number N of pulses has been counted.

* * * * *